United States Patent
Chiang et al.

(10) Patent No.: US 10,648,073 B2
(45) Date of Patent: May 12, 2020

(54) METHOD OF PREPARING FIBER SENSING DEVICES THROUGH LOW-TEMPERATURE MAGNETIC CONTROL SPUTTERING

(71) Applicant: NATIONAL KAOHSIUNG UNIVERSITY OF APPLIED SCIENCES, Kaohsiung (TW)

(72) Inventors: Chia-Chin Chiang, Kaohsiung (TW); Tso-Sheng Hsieh, Kaohsiung (TW); Hsiang-Chang Hsu, Kaohsiung (TW)

(73) Assignee: NATIONAL KAOHSIUNG UNIVERSITY OF SCIENCE AND TECHNOLOGY, Kaohsiung (TW)

( * ) Notice: Subject to any disclaimer, the term of this patent is extended or adjusted under 35 U.S.C. 154(b) by 294 days.

(21) Appl. No.: 15/721,670

(22) Filed: Sep. 29, 2017

(65) Prior Publication Data
US 2018/0148829 A1 May 31, 2018

Related U.S. Application Data

(63) Continuation-in-part of application No. 15/363,251, filed on Nov. 29, 2016, now abandoned.

(51) Int. Cl.
| | | |
|---|---|---|
| *C23C 14/35* | (2006.01) | |
| *C21D 9/08* | (2006.01) | |
| *C23C 14/34* | (2006.01) | |
| *C23C 14/06* | (2006.01) | |
| *C23C 14/50* | (2006.01) | |

(52) U.S. Cl.
CPC ............ *C23C 14/35* (2013.01); *C21D 9/08* (2013.01); *C23C 14/0641* (2013.01); *C23C 14/34* (2013.01); *C23C 14/505* (2013.01)

(58) Field of Classification Search
CPC .......... C23C 14/505; C23C 14/34–505; C23C 14/0641; G01K 11/3206
See application file for complete search history.

(56) References Cited

U.S. PATENT DOCUMENTS 5,690,796 A * 11/1997 DuPont ............... C23C 14/0078
   204/192.12
6,731,849 B1 * 5/2004 Singh ................... C03C 25/226
   204/192.12

(Continued)

FOREIGN PATENT DOCUMENTS

JP    10324530 A  * 12/1998  ........... C03B 11/086

OTHER PUBLICATIONS

Miyaura, Machine Translation, JP H10-324530 A (Year: 1998).*
Encyclopaedia Britannica, Electric Field (Year: 2015).*

*Primary Examiner* — Rodney G McDonald
*Assistant Examiner* — Ho-Sung Chung
(74) *Attorney, Agent, or Firm* — Chun-Ming Shih

(57) ABSTRACT

The present invention relates to a sputtering method, which is placing and fixing a fiber Bragg grating base material in a vacuum sputtering cavity, then pumping in a first gas or a second gas or both in the sputtering cavity and maintaining at the best set temperature, pressure and electric field intensity, sputtering a Cr-, Zr-, Ti- or AlTi-contained metal compound target with a sputtering current to the surface of the fiber grating base material to form a high-temperature-resistant film containing said metal nitride, which can enable the sensor to tolerate a working environment with a temperature of over 500° C. and still maintain its efficiency.

11 Claims, 4 Drawing Sheets

(56) References Cited

U.S. PATENT DOCUMENTS

| | | | | |
|---|---|---|---|---|
| 2003/0015136 A1* | 1/2003 | Giacri | ................... | C23C 14/505 |
| | | | | 118/500 |
| 2009/0142621 A1* | 6/2009 | Peng | ................... | C23C 14/0036 |
| | | | | 428/831 |
| 2012/0251023 A1* | 10/2012 | Gaertner | ............... | C23C 14/046 |
| | | | | 384/276 |
| 2013/0029174 A1* | 1/2013 | Chiang | ............... | C23C 14/0036 |
| | | | | 428/627 |
| 2016/0248117 A1* | 8/2016 | Liang | ............... | H01M 10/0562 |

* cited by examiner

METHOD OF PREPARING FIBER SENSING DEVICES THROUGH LOW-TEMPERATURE MAGNETIC CONTROL SPUTTERING

RELATED APPLICATIONS

This application is continuation-in-part application of U.S. patent application Ser. No. 15/363,251, filed on Nov. 29, 2016.

BACKGROUND OF THE INVENTION

1. Field of the Invention

The invention relates to a sputtering method, and in particular, a method that employs low-temperature magnetic control technology to sputter sensing devices with fiber grating.

2. Description of the Prior Art

To meet the demand of the society today, more advanced automatic monitoring or long-distance telemetry systems have been applied in all fields, while those systems need a lot of sensing devices. Therefore, the advancement of sensing devices has become a key role in the advancement of the whole system.

In terms of traditional technology, electronic sensing devices have used the principle of electromagnetism, which uses the change in the electrical properties of measuring components (such as voltage and resistance) caused by environmental effect to sense the physical or chemical parameters of the environment in which the sensing device is. Take the temperature sensing device for example. It has used the property of the metal conductor in it that they have different resistance values under different temperatures to measure the resistance or voltage value of the metal conductor and then interpret the corresponding temperature parameter. As for the ion sensing device, it measures ion density by measuring the electrical conductivity of the measured object. The strain sensing device measures strain change by making use of the property that the resistance value changes as the length of resistance wire changes.

However, as electronic circuits can be interfered by external electromagnetic field, leading to noise or signal distortion during the sensing of the sensing device. Moreover, the properties of the metal conductor make it easy to be affected by damp and thus corrode, so its service life is relatively short, which has thus affected the device.

To solve the foregoing problems, may non-electronic sensing devices have been recently developed and manufactured. Among them, the optical sensing component that uses the properties of optics for sensing, due to its excellent characteristics such as wide band, low loss, excellent insulation, protection against electromagnetic interference and corrosion resistance, has become the main trend in the current sensor research and development.

Superconducting materials, which have zero resistance when they are in the superconducting state, are very suitable for being used in occasions that require high-speed transmission such as high tension cables. Therefore, many researchers have dived in the research of superconducting cables. However, as superconducting materials can only maintain zero resistance when their temperature is lower than the critical temperature of superconducting. If their temperature is higher than the critical temperature, the resistance of the superconducting materials will increase sharply, making them no different from common conducting materials. Therefore, how to keep the temperature of the conducting layer of the superconductor in the whole superconducting cable below its critical superconducting temperature is a difficult problem in the current superconducting cable research. Moreover, as superconducting materials are generally fragile ceramic materials, when the superconducting cable receives certain stress, the superconducting materials of the conducting layer of its superconductor will lose its conductivity.

SUMMARY OF THE INVENTION

To solve the foregoing problems, the present invention provides a method of preparing fiber sensing devices through low-temperature magnetic control sputtering. The sensing device prepared this way can be applied on the superconducting cable suitable for certain working temperature, which can make it easy to monitor the temperature of the cable under the superconducting state.

The method of preparing fiber sensing devices through low-temperature magnetic control sputtering of the present invention comprises of at least the following steps.

Base material setting: First, place a fiber grating base material in a vacuum sputtering cavity and fix the fiber grating base material with fixture in the sputtering cavity, and the fiber grating base material is fixed on a fixture within the vacuum space of the sputtering cavity, wherein the rotation direction of the fixture is opposite to the revolution direction of the support thereof and the fixture is H type wherein the upper and lower parts are thicker than the middle; The fiber grating base material comprises of one fiber core, a fiber cladding that houses the fiber core and Bragg grating on the fiber core.

Sputtering environment setting: Pump a first gas or a second gas or both in the sputtering cavity, and adjust the environment in the sputtering cavity to maintain it at a set temperature, a set pressure and an electric field intensity, wherein the first gas is nitrogen ($N_2$) and the second gas is argon (Ar). The first gas is pumped in for 15 min at a rate of 150-160 standard milliliters (sccm) per unit time; and the second gas is pumped in for 2 min at a rate of 78-82 standard milliliters (sccm) per unit time. The set temperature is between 100-200° C., the set pressure is between $0.9 \times 10^{-2}$–$1.9 \times 10^{-2}$ Torr, and the electric field intensity is between 17–23V.

Sputtering: Sputter a metal compound target with a sputtering current to the surface of the fiber grating base material to form a high-temperature-resistant film that covers the surface, wherein the sputtering current is between 65-75 A and generally the sputtering process lasts 15 min; the metal compound target is any of a Cr-contained metal compound, a Zr-contained metal compound, a Ti-contained metal compound or a AlTi-contained metal compound, or a combination of two or more of the compounds. Therefore, the high-temperature-resistant film is a ceramic coating that combines nitrogen with Cr, Zr, Ti or AlTi.

Optional or repeated annealing: Anneal the sputtered metal compound target and the high-temperature-resistant film by pumping in the second gas or vacuum in the sputtering cavity.

A fiber grating sensor that is prepared in the foregoing steps in the sensing device preparation method through low-temperature magnetic control sputtering of the present invention should be a fiber grating sensor coated with the high-temperature-resistant film that contains a Cr-contained metal compound, a Zr-contained metal compound, a Ti-contained metal compound or a AlTi-contained metal compound, which enables the whole fiber grating sensor to tolerate a high-temperature working environment that is over 500° C. and still keep its sensing sensitivity as a senor.

DETAILED DESCRIPTION OF THE PREFERRED EMBODIMENT

Figure 1:
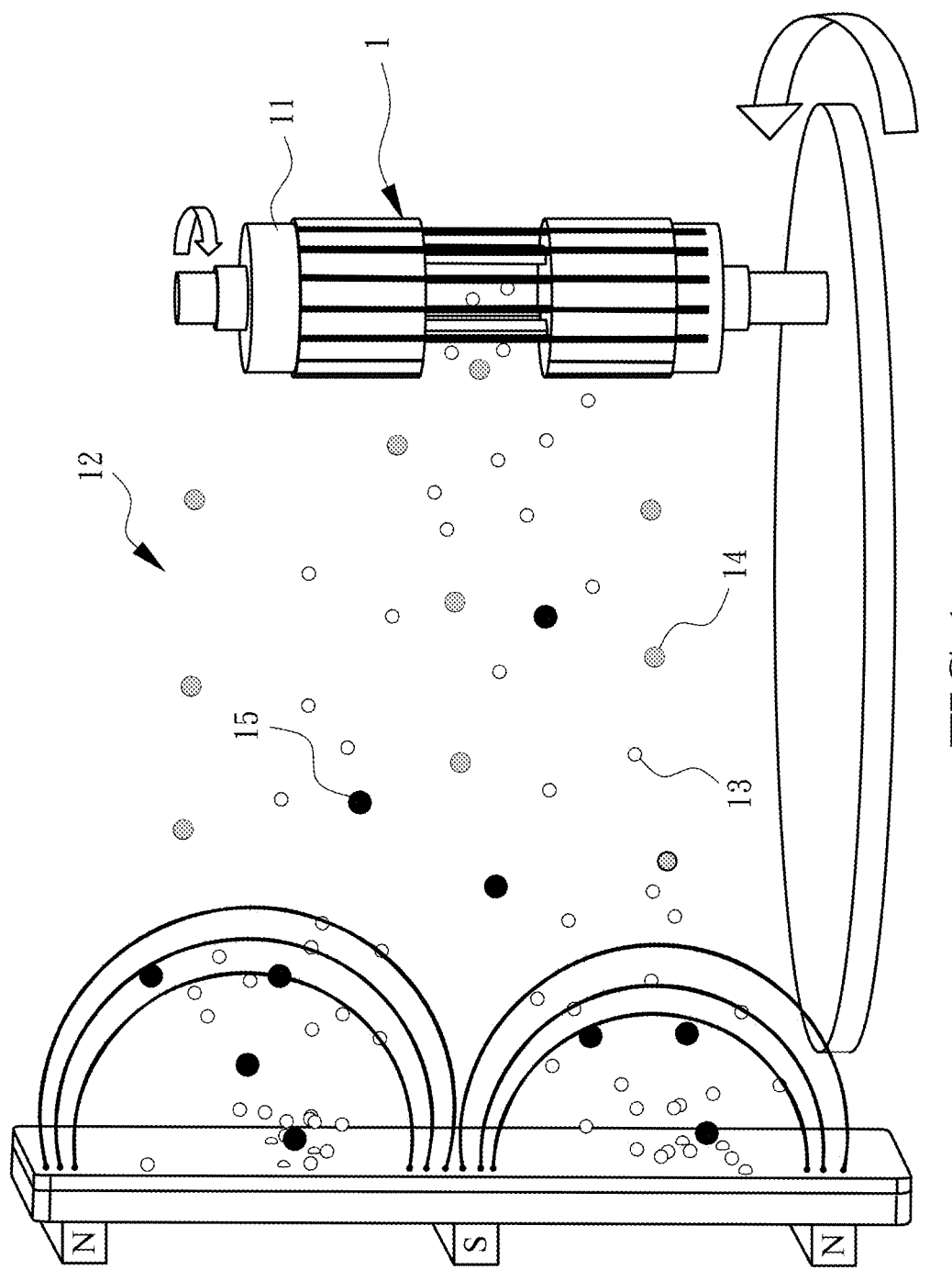
FIG. 1 is a sectional view of the sputtering process of the present invention.

The present invention will be now further described by referencing the appended figures representing preferred embodiments. First, please refer to FIG. 1, which is a process diagram of the sputtering process of the present invention and is a third person view of a target material and a base material in a sputtering cavity of a sputter, wherein a fiber grating base material 1 is fixed on a fixture 11, while both the fiber grating base material 1 and the fixture 11 are in a vacuum space 12 in the sputtering cavity. The fiber grating base material 1 can rotate 360 degrees via the FIG. 11 and the support thereof, of which the purpose is to enable the whole surface of the fiber grating base material 1 to be sputtered. During the sputtering process, the vacuum space 12 in the sputtering cavity will be pumped in nitrogen and argon (argon ions 13 and nitrogen ions 14 can be seen with a microscopic view). During sputtering, metal ions 15 excited from the target material by the sputter move towards the fiber grating base material 1 in the vacuum space 12 under electric field control, and finally have an action with nitrogen ions 14 and form a metal nitride ceramic film on the fiber grating base material 1, while argon ions 13 are used to control inert media in the environment during sputtering.

Further, the rotation direction of the fixture 11 is opposite to that of the support thereof time for coating can be shortened and the coating effectiveness can be improved by the opposite direction between the rotation of the fixture 11 and the revolution of the support thereof. Furthermore, the fixture is H type wherein the upper and lower parts are thicker than the middle; when the fiber grating base material 1 is fixed on the fixture 11, only the upper, lower section of the fiber grating base material 1 are fixed on the fixture 11 while the middle section of the fiber grating base material 1 is not interrupted by the fixture 11 and further forms a spatial distance from the middle part of the fixture 11, therefore the fiber grating base material 1 at the middle end of the fixture 11 may not be withstood by the fixture through the spatial design of thinner middle end of the fixture 11 so as to allow the fiber grating base material 1 at the middle section to be coated effectively.

The sputter used in the present invention should be a magnetron sputter. In the embodiment, a ULVAC dual stage oil vacuum pump (the throughput is 288 m$^3$/H and the vacuum degree is 53 m Thor), a cryo pump and a DC power supply unit (the maximum output power is 1,500 W) are adopted. The heater is resistant to 800° C., which enables the sputter to be used under 650° C. for a long time. The air flow in the sputtering cavity is controlled by a mass flow controller, the cooling system of the sputter is realized by running cooling water on the turbomolecular pump, the sputtering gun and the outer wall of the sputtering cavity to prevent high temperature damaging the system.

Figure 2:
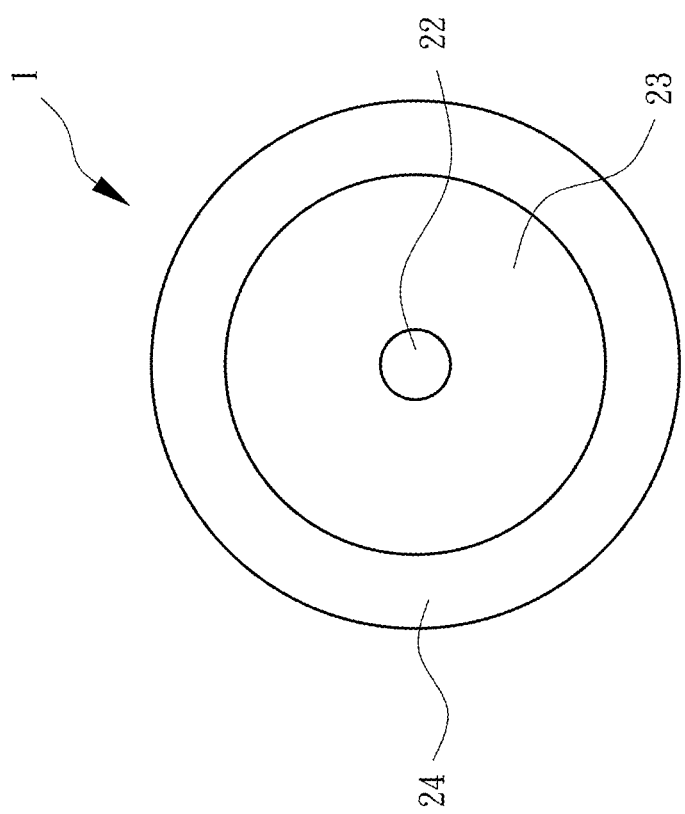
FIG. 2 is a sectional view of the fiber Bragg grating sensor base material of the present invention.
Figure 3:
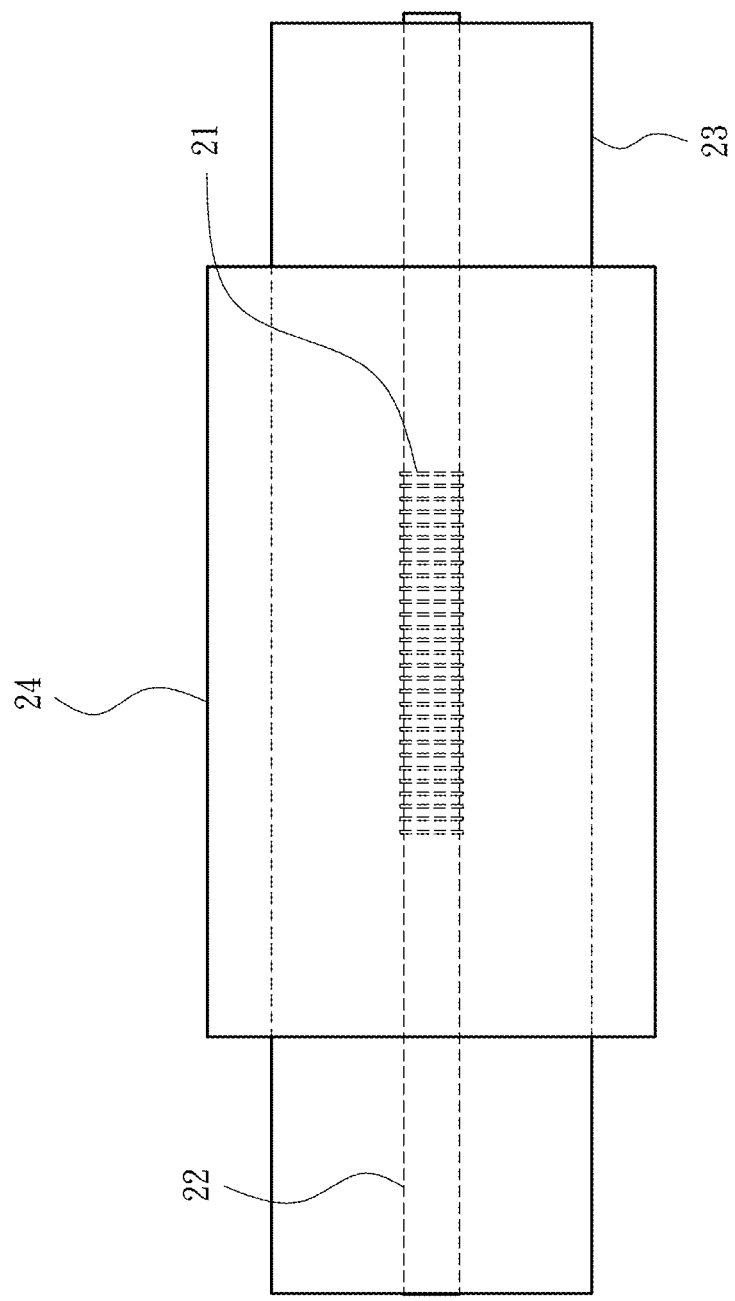
FIG. 3 is a side view of the fiber Bragg grating sensor base material of the present invention.

FIG. 2 and FIG. 3 are sectional and side views of the fiber Bragg grating sensor base material in the present invention, wherein the fiber grating base material 1 sputtered in the present invention comprises a fiber core 22, a fiber cladding 23 and a metal nitride film 24 that covers the fiber core 22 and the fiber cladding 23. As shown in FIG. 3, part of the fiber core 22 has grating 21 and the metal nitride film 24 is coated on the fiber part that has grating, because the role of the metal nitride film 24 is to protect the optical properties of the grating and ensure its normal operation.

Figure 4:
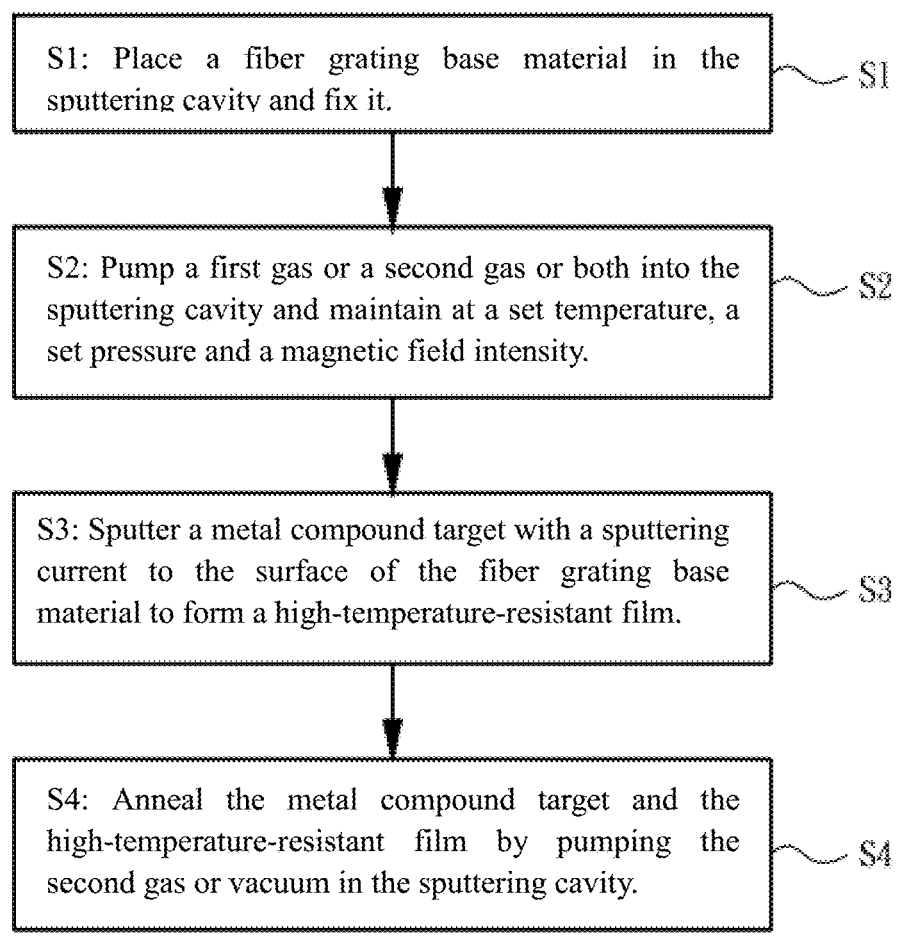
FIG. 4 is a step diagram of the present invention.

Finally, please refer to FIG. 4, a process diagram that describes fully the method of preparing fiber sensing devices through low-temperature magnetic control sputtering in the present invention, which has the following steps:

S1: Place a fiber grating base material in the vacuum sputtering cavity of a sputter and fix it by fixture, wherein the fiber grating base material, as shown in FIG. 3, comprises a fiber core 22, a fiber cladding 23 that houses the fiber core and grating 21 on the fiber core.

S2: Pump a first gas or a second gas or both in the sputtering cavity, and adjust the environment in the sputtering cavity to maintain it at a set temperature, a set pressure and an electric field intensity, wherein, preferably, the first gas is nitrogen (N2) and the second gas is argon (Ar). The first gas is pumped in for 15 min at a rate of 150~160 standard milliliters (sccm) per unit time; and the second gas is pumped in for 2 min at a rate of 78~82 standard milliliters (sccm) per unit time. The said set temperature and magnetic control sputtering low-temperature are all between 100~200° C., the set pressure is between 0.9×10-2~1.9×10-2 Torr, and the electric field intensity is between 17-23V.

S3: Sputter a metal compound target with a sputtering current to the surface of the fiber grating base material to form a high-temperature-resistant film, the high-temperature is over 500° C., wherein the sputtering current is between 65-75 A and generally the sputtering process lasts 15 min; and preferably, the metal compound target is any of a Cr-contained metal compound, a Zr-contained metal compound, a Ti-contained metal compound or a AlTi-contained metal compound, or a combination of two or more of the compounds, so as to make the high-temperature-resistant film a ceramic coating that combines nitrogen with Cr, Zr, Ti or AlTi.

S4: Pump in the second gas or vacuum in the sputtering cavity to anneal the metal compound target and the high-temperature-resistant film after sputtering.

Those are the main steps of the method of preparing fiber sensing devices through low-temperature magnetic control sputtering in the present invention.

Therefore, it's clear that the main purpose of the present invention is to manufacture a high-temperature-resistant fiber grating sensing device and what more needs to be learnt is the effect of the device. An embodiment is therefore presented below to compare the sensing device prepared with the method of the present invention and a sensing device that is not prepared with the method of the present invention to describe the effect of the invention. First, in the embodiment the high-temperature resistance of two sensing devices is compared, wherein one sensing device is a fiber Bragg grating (FBG) sensor with a CrN film that is prepared with the method of the present invention and the other sensing device is a bare FBG sensor without the film.

The fiber of the FBG used in the embodiment is a PS 1250/1500 (fiber core/fiber cladding) fiber, wherein the core has a diameter of 9.6 μm and the cladding is made of SiO2 and has a diameter of 124.9 μm. The fiber Bragg grating is read in using a 248 nm KrF-excimer laser and the grating length is 5 mm.

Sputter a 2.2 μm-thick CrN film on the said FBG sensor using the method of the present invention, that is, prepare a CrN film coated on the FBG. In the embodiment, according to the analysis of an energy dispersive spectrometer EDS), the component ratio of Cr in the CrN film is 85.09 wt % and that of N2 is 14.91 wt %. The sensor is a FBG sensor prepared with the method of the prevention that can operate under a temperature of over 500° C.

The other sensor used for comparison is a bare FBG sensor, which does not have a film prepared with the method of the present invention.

In the experimental environment of the embodiment, the fiber Bragg gratings of the two FBG sensors are heated in a heating furnace and the working temperature in the heating furnace is increased from 100° C. to 650° C. Every time after the temperature is increased by 50° C., maintain the temperature for 10 min and measure the two FBG sensors ten times and adopt the average spectrum values of the center wavelength and light intensity of the sensors for analysis.

The heat resistance experiment results of the fiber Bragg gratings of the two FBG sensors which are heated in the heating furnace in the embodiment show that the FBG sensor with a CrN film has better high temperature resistance and the highest temperature it is resistant to is 650° C.; in comparison, the frequency spectrum of the bare FBG sensor in the control group already disappears when the temperature in the heating furnace is over 450° C. Moreover, in the temperature range from 100° C. to 450° C., the temperature sensing sensitivity of the bare FBG sensor is 11.9 pm/° C., while that of the FBG sensor with a CrN film is 13.0 pm/° C., which is clearly higher than that of the bare FBG sensor.

In addition, in the temperature range from 450° C. to 650° C., the temperature sensing sensitivity of the FBG sensor with a CrN film is even higher, 15.5 pm/° C. Therefore the experiment in the embodiment can prove that the CrN film sputtered with the method of the present invention can spread the nitrogen atoms it contains in a high-temperature environment to the fiber cladding and fiber core so as to protect the stability of the boron and gas bonding in the photosensitive materials of the FBG in the fiber core and ensure the properties of the grating still exist under high temperature.

Additionally, in another embodiment of the present invention that compares the high temperature resistance of the two sensing devices, wherein one sensor is a FBG sensor with a ZrN film and the other is a bare FBG sensor without any film. The FBG sensors have the same specifications as those used in the previous embodiment, except that the sensor has a ZrN film with a thickness of about 1.5 μm that is sputtered with the method of the present invention.

In the experimental environment of the embodiment, the fiber Bragg gratings of the two FBG sensors are heated in a heating furnace and similarly the working temperature in the heating furnace is increased from 100° C. to 650° C. Every time after the temperature is increased by 50° C., maintain the temperature for 10 min and measure the two FBG sensors ten times and adopt the average spectrum values of the center wavelength and light intensity of the sensors for analysis.

The temperature experiment results of the embodiment show that the FBG sensor with a ZrN film can tolerate 650° C. The spectrogram of the experiment shows that the temperature sensitivity of the FBG sensor with a ZrN film when the working temperature range is from 100° C. to 400° C. is 10.4 pm/° C., and preferably, it is higher, 19.5 pm/° C., when working temperature range is from 400° C. to 600° C., even better than 15.5 pm/° C. of the FBG sensor with a CrN film. Moreover, the light intensity of the ZrN film stabilizes at −27.20 dB when the temperature range is from 400° C. to 600° C., which further indicates that ZrN has excellent optical characteristics and the FBG sensor with a ZrN film will be an excellent high-temperature-resistant sensor.

In conclusion, the present invention is an innovation in technological idea and has many effects that prior art doesn't have. It fully complies with the novelty and advancement requirements of legal patents for invention. We therefore apply for patent for the present invention.

What is claimed is:

1. A method of preparing a fiber sensing device through low control sputtering comprising:

placing a fiber grating base material in a sputtering cavity wherein the fiber grating base material is fixed on a fixture within a vacuum space of the sputtering cavity, the fixture is positioned on a support within the vacuum space, the fixture is formed having an upper part, a lower part, and a middle part formed between the upper part and the lower part, the upper part and the lower part are both thicker than the middle part, an upper sections of the fiber grating base material is fixed on the upper part of the fixture, a lower section of the fiber grating base material is fixed on the lower part of the fixture, and a spatial space is formed between a middle section of the fiber grating base material and the middle part of the fixture to leave the middle section exposed;

pumping a first gas, a second gas, or both in the sputtering cavity and maintaining a set temperature, a set pressure and an applying voltage; and sputtering a metal compound target with a sputtering current to a surface of the fiber grating base material to form a film having a heat resistance at 100 to 650° C. thereon while the fixture is rotating in a direction, the support is rotating in a direction, and the rotation direction of the fixture is opposite to that of the support.

2. The method recited in claim 1 wherein said metal compound target is any of a Cr-contained metal compound, a Zr-contained metal compound, a Ti-contained metal compound or a AlTi-contained metal compound.

3. The method recited in claim 1 wherein said first gas is nitrogen ($N_2$).

4. The method recited in claim 1 wherein said second gas is argon (Ar).

5. The method recited in claim 3 wherein a pumping rate of said first gas is 150-160 standard milliliters (sccm) per unit time.

6. The method recited in claim 3 wherein a pumping rate of said second gas is 78-82 standard milliliters (sccm) per unit time.

7. The method recited in claim 1 wherein said set temperature is 100~200° C.

8. The method recited in claim 1 wherein said set pressure is $0.9\times10^{-2}$ to $1.9\times10^{-2}$ Torr.

9. The method recited in claim 1 wherein said applying voltage is 17-23V.

10. The method recited in claim 1 wherein said sputtering current is 65-75 A.

11. The method recited in claim 1 further comprising:
   annealing the metal compound target and film having a heat resistance at 100 to 650° C. in the sputtering cavity with the second gas or vacuum.

\* \* \* \* \*